(12) United States Patent
Fjelstad et al.

(10) Patent No.: US 7,919,355 B2
(45) Date of Patent: Apr. 5, 2011

(54) MULTI-SURFACE IC PACKAGING STRUCTURES AND METHODS FOR THEIR MANUFACTURE

(75) Inventors: Joseph C. Fjelstad, Maple Valley, WA (US); Para K. Segaram, Brookfield (AU); Thomas J. Obenhuber, San Francisco, CA (US); Inessa Obenhuber, legal representative, San Francisco, CA (US); Kevin P. Grundy, Fremont, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/778,972

(22) Filed: May 12, 2010

(65) Prior Publication Data

US 2010/0221871 A1 Sep. 2, 2010

Related U.S. Application Data

(62) Division of application No. 11/353,564, filed on Feb. 13, 2006, now Pat. No. 7,737,545, which is a division of application No. 10/947,686, filed on Sep. 23, 2004, now Pat. No. 7,061,096.

(60) Provisional application No. 60/506,322, filed on Sep. 24, 2003.

(51) Int. Cl.
*H01L 21/56* (2006.01)
(52) U.S. Cl. .......... 438/107; 257/E21.502; 257/E23.01; 257/692
(58) Field of Classification Search .................. 257/692; 438/107, E21.502
See application file for complete search history.

(56) References Cited

U.S. PATENT DOCUMENTS

| 6,369,454 | B1 * | 4/2002 | Chung ......................... 257/787 |
| 6,818,973 | B1 * | 11/2004 | Foster .......................... 257/676 |
| 7,572,680 | B2 * | 8/2009 | Hess et al. .................... 438/124 |

\* cited by examiner

*Primary Examiner* — Benjamin P Sandvik
*Assistant Examiner* — Krista Soderholm
(74) *Attorney, Agent, or Firm* — Myers Bigel Sibley & Sajovec, P.A.

(57) ABSTRACT

An IC package having multiple surfaces for interconnection with interconnection elements making connections from the IC chip to the I/O terminations of the package assembly which reside on more than one of its surfaces and which make interconnections to other devices or assemblies that are spatially separated.

21 Claims, 5 Drawing Sheets

MULTI-SURFACE IC PACKAGING STRUCTURES AND METHODS FOR THEIR MANUFACTURE

CROSS-REFERENCE TO RELATED APPLICATIONS

This application is a Divisional of U.S. patent application Ser. No. 11/353,564 filed Feb. 13, 2006, which is a Divisional of U.S. patent application Ser. No. 10/947,686, filed Sep. 23, 2004 and issuing as U.S. Pat. No. 7,061,096 on Jun. 13, 2006, which claims benefit of priority of U.S. Provisional Application No. 60/506,322, filed Sep. 24, 2003. U.S. Provisional Application No. 60/506,322, U.S. Pat. No. 7,061,096, and U.S. patent application Ser. No. 11/353,564 are hereby incorporated by reference in their entirety.

FIELD OF THE INVENTION

The present invention relates to the field of packaging of semiconductor integrated circuits.

BACKGROUND

Current integrated circuit (IC) chip packaging technologies commonly rely on either a lead frame, interposer or miniature interconnection substrate to serve as an interconnection base for redistributing the I/O (input/output terminals) of the IC to a more practical and useful lead spacing or pitch between I/O terminals for next level assembly. Interconnection between the IC or die is normally accomplished using either wire bonding or flip chip technology. The I/O terminals on the finished IC package are located either on the sides of or beneath the chip, however in some special cases, such as for stacking memory ICs to increase memory density, the terminals may be provided with a common land that can be accessed from both top and bottom. The lead frames, interposers and miniature interconnection substrates that provide the I/O pitch translation, obviously have associated with them both materials and manufacturing cost.

Moreover, for some types of I/O pitch translation devices, such as miniature interconnection substrates there is an associated cost for testing to assure that all connections are complete and that there are no electrical shorts.

Because each IC chip design is unique, the interconnection substrate used in manufacture of the final package is often also unique to the chip and requires the creation of a package design with each interconnection requiring its own circuit path on the substrate. This is especially true for higher I/O count ICs. Thus time, materials and processes used to create IC packages while providing benefit also add to cost and delay in terms of manufacturing lead time which can limit opportunity associated with getting a product to market early. Of course in the best case, any interconnection would be made directly to the IC termination land and this can be and often is the case for chips having few I/O terminations. However, as I/O counts rise, this becomes a problem, thus a circuit substrate is commonly used to redistribute the I/O and the terminations to the chip are made locally. In addition because of the limits of current manufacturing practices, the same interconnection materials and process steps which add cost to the overall structure also typically limit both its performance and abrogate its versatility. Performance limits are due to the electrical parasitics associated with the changes in circuit materials, transitions through and around electrical features such as vias the like which in turn limit the design versatility.

As a result of these limitations of current IC package design and manufacturing practices thus leave room and opportunity for improvements.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
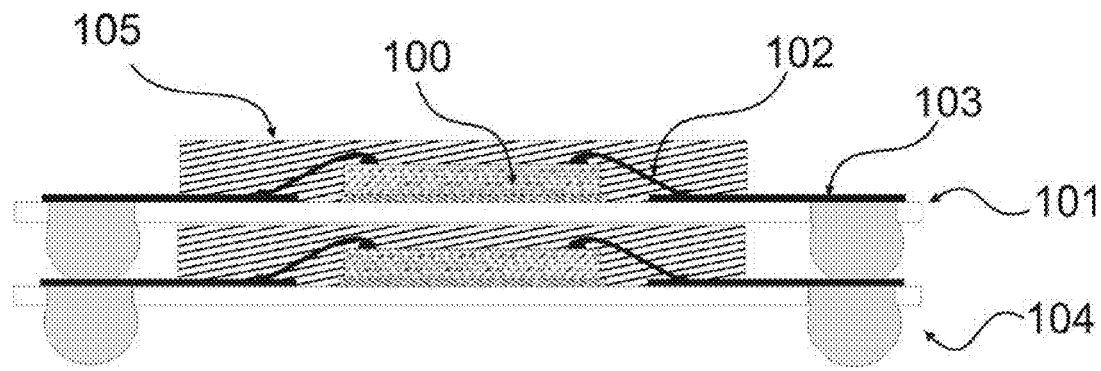
FIG. 1 provides an example of prior art.

In the following description and in the accompanying drawings, specific terminology and drawing symbols are set forth to provide a thorough understanding of the present invention. In some instances, the terminology and symbols may imply specific details that are not required to practice the invention. Disclosed herein is a method for making direct path, three dimensional interconnections from the surface of and integrated circuit chip to locations away from the chip face and body. The finished package structure has terminations that are accessible from all of its surfaces and edges. For example, in the case of a hexahedron (i.e., a cubic or rectangular box) the number of regular surfaces available would be six (6) while in the case of a hemisphere or a flatted structure with rounded edges, the number of surfaces available would be two (2), one of which would be planar and the other a continuous surface with terminations at different points across its surface. A package created using the concepts of invention can be created with the terminations regularly spaced to a standard pitch or they can be constructed so as to provide a non-standard, random or pseudo-random interconnection pattern across the surface, provided that no space violations are allowed to occur. Such structures would allow the user of the invention to create individual parts or even individual, piece-specific, interconnection terminations to defeat attempted use in unauthorized products or applications. Such capability could be of great benefit in the creation of secure electronics hardware. In such cases, of course, the mating interconnection pattern would then be specifically created to make the required connections.

In practicing the invention, any three dimensional shape having multiple surfaces is a potential structure that will allow for space transformation of the terminals on the IC chip to locations distant in two dimensional (i.e. in the same plane) or three dimensional space relative to the IC chip. The distal terminations can then be used for making interconnection to either an electronic interconnection substrate or other electronic-assembly elements including other components, connectors and cables. The package is constructed with external terminations located on two or more surfaces including top, bottom and one or more edges (i.e. terminations can to be made from any appropriate surface, such as from the bottom, from the top or from all sides or any surfaces presented).

The structure will also provide improved thermal management because of the direct path, high thermal conductivity wires used in concert with the encapsulant employed. In certain embodiments the structure can also be manufactured with embedded ESD protection in the package allowing it to be moved off the chip which can also help to reduce the size of the IC.

There are envisioned numerous potential methods and embodiments for creating the structures of this invention, the following figures are descriptive of a few such and instructive of the methods that can be used in their manufacture. However, the scope of the invention, including potential embodiments of the invention, methods used for their construction relative to the methods herewith disclosed and potential interconnection structures created by using the invention to interconnect spatially separated electronic components are not the limited by to figures provided. The concepts can be applied to signals transmitted in a wide range of the electromagnetic spectrum and thus conductors may be of any suitable material and construction including single wire, coaxial wires, twin axial wires or optical fibers.

IC chips are commonly mounted to interconnection substrates which have circuitry on them for redistributing the terminations to a usable pitch for making interconnections to other devices or higher level interconnection substrates. In some cases, these substrates are created in a manner that allows the use of the top of a package to interconnect directly to other IC packages. This method has been used in the electronics industry to increase the function or quantity of IC chips in a reduced volume. FIG. 1 is shows an example of prior art for stacking IC packages using interconnection substrates directly one atop another. In the figure an IC chip (100) is mounted on an interconnection substrate (101) having traces (103) to which the chip is connected by wires (102) and then encapsulated to protect the wires and chips using a suitable encapsulant (105). The chip package has terminations that provide access top and bottom to a common conductor (103) allowing packaged devices having common termination structures to be stacked and interconnected by means of solder balls (104). This technique is common for stacking of memory ICs.

Figure 2:
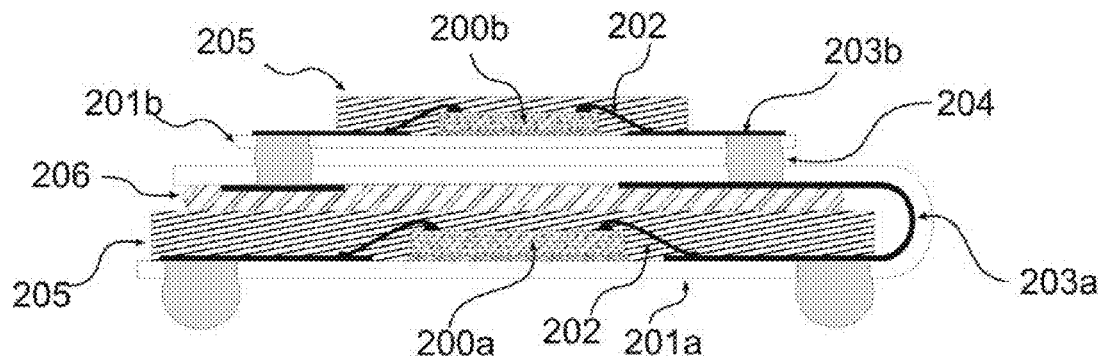
FIG. 2 provides a further example of prior art.

FIG. 2 provides a further example of prior art, that of a so called "fold over" package. Again a first interconnection substrate or circuitized package substrate is used (201a) with the IC chip of the lower package (200a) interconnected such as by wires (202). The package substrate is provided with an extra length of circuitry and has a termination pattern on it designed in a manner that the I/O of the extra length can be interconnected to a second IC (200b) within a second package on a second interconnection substrate (201b). The circuit trace providing an interconnection path (203a) is folded and bonded to the top of the encapsulant (205) of the first chip package using a suitable adhesive (206). The second chip package can then be mounted and interconnected by solder ball connections (204) to chip terminal connection on the second chip package (203b) This technique is commonly used for interconnecting chips having different functions directly atop one another. As an example such a structure could use an SRAM chip and a Flash memory chip.

Figure 3:
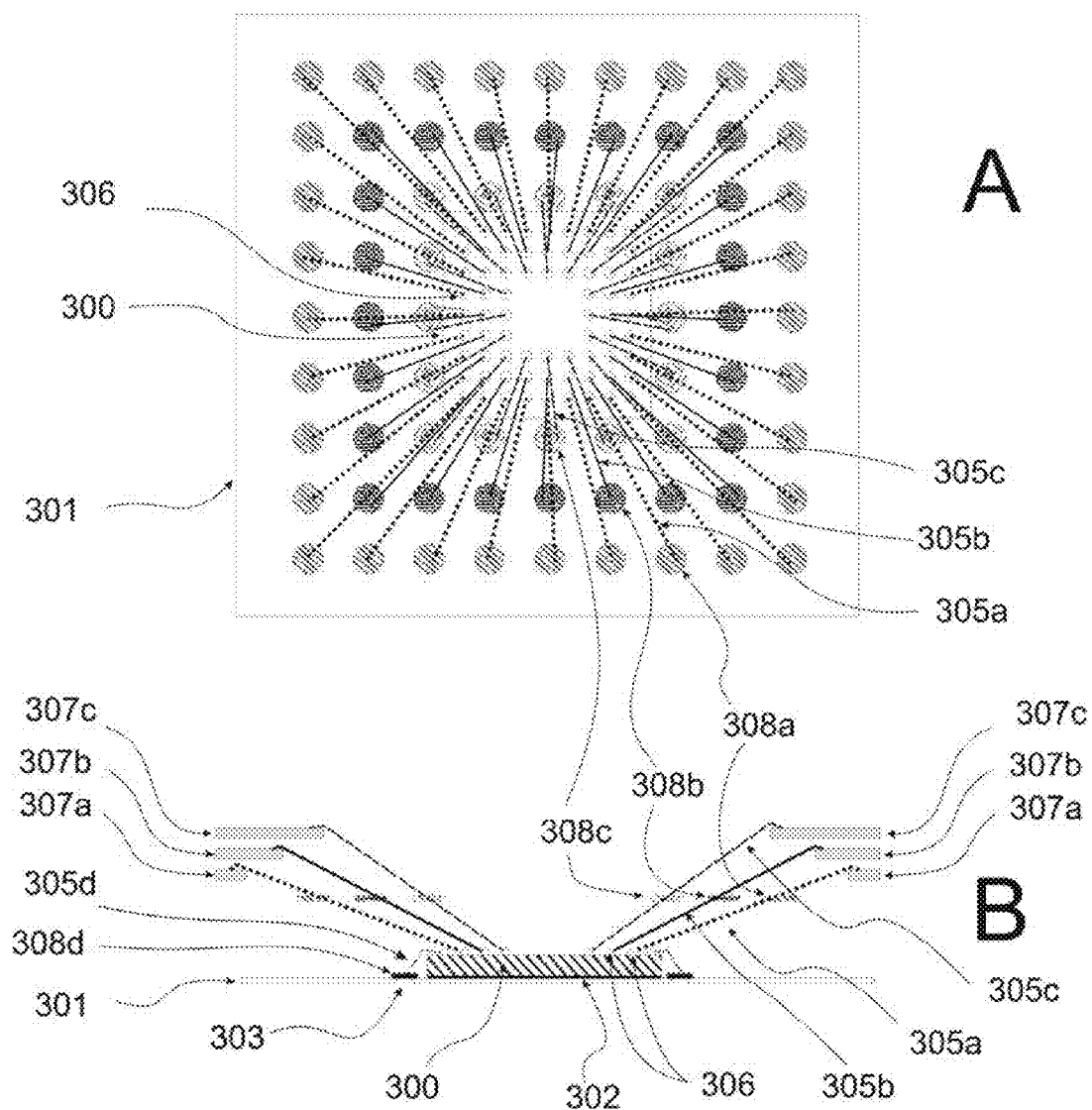
FIG. 3 illustrates a prospective arrangement of the interconnections for an embodiment of the invention which illustrates how point to point interconnections can be made in three dimensional space.

In all known cases of prior art, only top and bottom surfaces are available for interconnection and a pre-circuitized substrate or a lead-frame is required for redistributing the I/O terminations. This invention enables interconnections to exist anywhere on the surface of a multidimensional or multi-surface IC package FIGS. 3A and 3B illustrate respectively top and side views of a prospective arrangement of the interconnections for an embodiment of the invention. In the graphic, the terminations on the IC chip are shown as an array to facilitate understanding and comprehension of the basic structure of invention, however the IC terminations residing only at the periphery of the IC chip are equally well adaptable for use in constructing the invention.

The illustration in FIG. 3A shows from the top view, how point to point interconnections can be made from an IC chip to terminations located on all surfaces of a three dimensional IC package. In the FIG. 3A the IC chip (300) is placed on a substrate (301). The terminals on the chip (306) are interconnected by wires (305a-305c) and pass through locations that ring the IC and which will become terminations on the finished package (308a-308c).

FIG. 3B provides a side view of the structure as it would be constructed in a partially completed condition. In the illustration are shown the bond wires (305a-305d), the chip (300) having I/O terminals (306) is bonded to the substrate (301) by means of a die attach (302). Holes in the substrate material (303) provide access to the terminal (308d).

This view clarifies the relative location of the wires, showing how the wires (305a-305c) do not interfere with each other while making direct connection between I/O locations on the chip to the terminals location of interest to each I/O terminal to terminal locations (308a-308c) for the finished package. FIG. 3B also better shows how wire bond interconnection (305d) is made from the chip to terminals (308d) on the substrate (301) that reside on the obverse side of what will be the finished package. FIG. 3B also illustrates in cross section, the ring mandrels (307a-307c) to which the wires are bonded. The ring mandrels are placed on a fixture (not shown) above the chip package assembly station. In the assembly process first or bottom most ring (307a) would be positioned and the first wire bonds are made from the I/O terminals on the chip to locations such that the wire (305a) passes through a location (308a) that will represent the terminal location on the finished package and is bonded to the ring mandrel. The process is repeated until all of the wires on the first ring are completed. A second ring (307b) having a smaller internal dimension is then positioned and a wire (305b) is bonded first to the chip and routed to pass through a location (308b) that will represent the terminal location on the finished package and is then bonded to the ring mandrel. The process is repeated until all of the wires on the second ring are completed. A third (or nth) ring (307c) having a smaller internal dimension than either ring 307a or ring 307b is then positioned and a wire (305c) is bonded first to the chip and routed to pass through a location (308c) that will represent the terminal location on the finished package and is then bonded to the ring mandrel. The process is repeated until all of the wires on the third (or nth) ring are completed. The number of rings needed depends on the number of I/O and their pitch.

Figure 4:
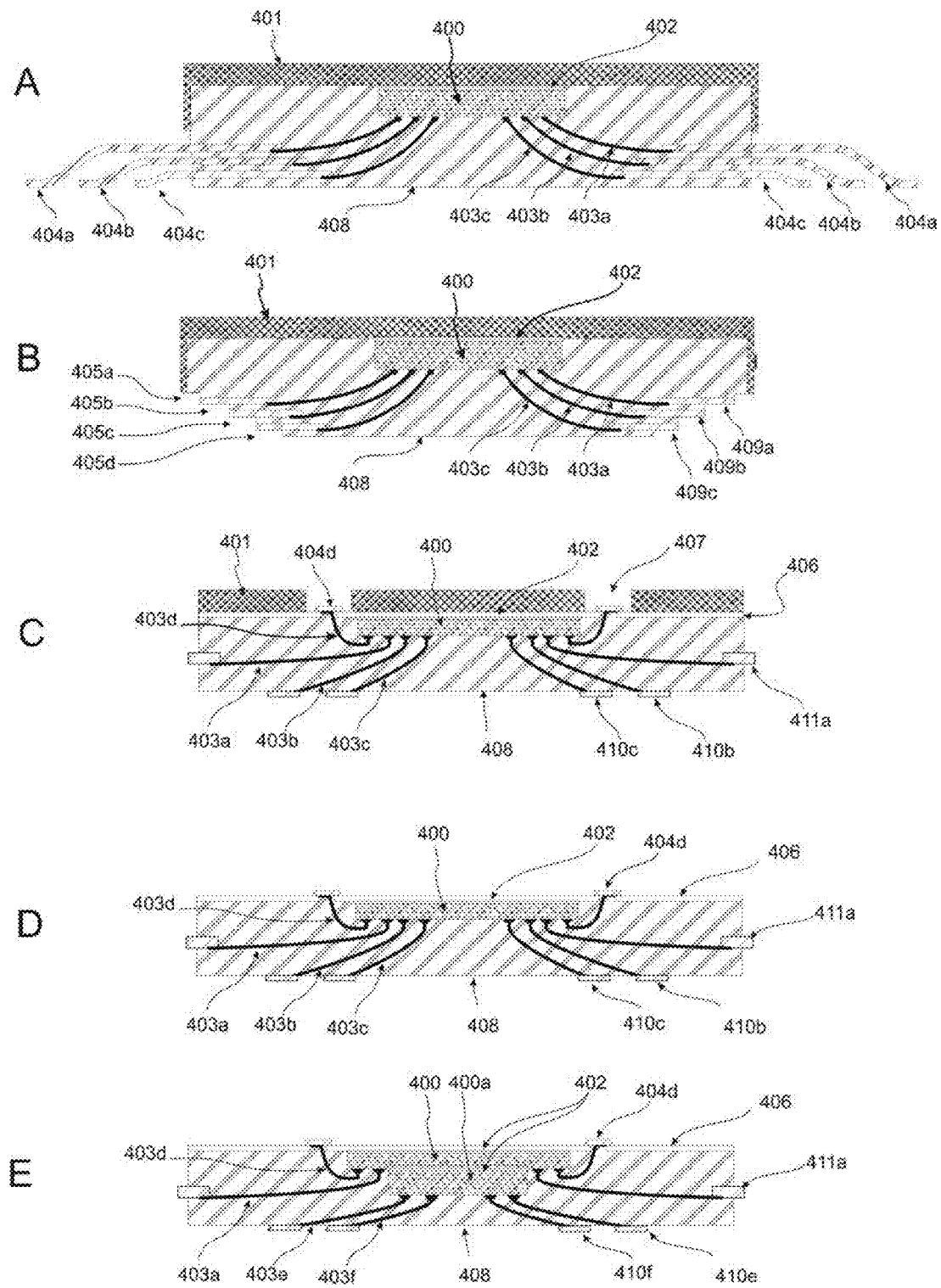
FIG. 4 A-D shows in cross section various embodiments of an IC package constructed in accordance with the concepts of the invention.

FIG. 4 A-D shows in cross section, representative embodiments of IC packages constructed in accordance with the concepts of the invention. In FIG. 4A an IC chip (400) is bonded to a heat spreader (401) by means of a thermally conductive die attach adhesive (402). Wires (403a-403c) are bonded from terminals on the chip to metal leads (404a-404c) which egress from the package at different levels and are then shaped so as to have all leads connected to a planar substrate. The assembly is then covered over selected areas with an encapsulant (408)

FIG. 4B shows an embodiment of the invention again having a die (400) attached to a heat spreader (401) using a thermally conductive die attach material. Bond wires (403a-403c) are connected from the chip to contacts (409a-409c). The contacts which are embedded with the wires in an encapsulant (408) are stair stepped to allow each of the contacts egress the package one atop another without shorting to one another. This is accomplished by making a series of cuts in the material to different depths (405a-405d) to expose the contacts In FIG. 4C is shown another embodiment of the invention wherein a chip (400) is bonded by means of a die attach adhesive (402) to a substrate (406) having terminals (404d) that can be wire bonded to directly. The subassembly is bonded to heat spreader (401) by means of a suitable adhesive (not shown). The heat spreader has holes within it (407) to permit access to terminations (404d) which reside on the obverse surface of the package. These terminals are connected to the chip by wires (403d). Other terminals on the chip are connected to other terminals on the package (410a, 410b and 411a) by means of bond wires (403a-403c). Also in the example. Terminal 411a egresses from the package on the side of the package while terminals 410a and 410b reside on the primary I/O terminal side of the IC package. An encapsulant (408) protects the wires and chip and fixes the terminal in place.

In FIG. 4D is shown an embodiment of the invention wherein a chip (400) is bonded by means of a die attach adhesive (402) to a substrate (406) having terminals (404d) that can be wire bonded to directly. Obverse surface terminals (404d) are connected to the chip by wires (403d). Other terminals on the chip are connected to other terminals on the package (410a, 410b and 411a) by means of bond wires (403a-403c) Also in the example, terminal 411a egresses from the package on the side of the package while terminals 410a and 410b reside on the primary I/O terminal side of the IC package. An encapsulant (408) protects the wires and chip and fixes the terminal in place.

In FIG. 4E is shown an embodiment of the invention wherein an IC chip (400) is bonded by means of a die attach adhesive (402) to a substrate (406) and a second IC chip (400a) is attached to the surface of chip 400 using another layer of die attach adhesive. The assembly having terminals (404d) that can be wire bonded to directly to either chip. The obverse surface terminals (404d) are connected to the chip by wires (403d). Other terminals on the first chip (400) are shown connected to other terminals on the package (411a) by means of bond wires (403a) and terminal 411a egresses from the package on the side of the package. In the figure, the second IC chip (400a) is also interconnected to terminals on the package by wires (403e and 403f). The terminals, 410e and 410f, reside on the primary I/O terminal side of the IC package. An encapsulant (408) protects the wires and chip and fixes the terminal in place.

FIG. 5A-J provides a prospective process for creating one embodiment of the invention.

Figure 5:
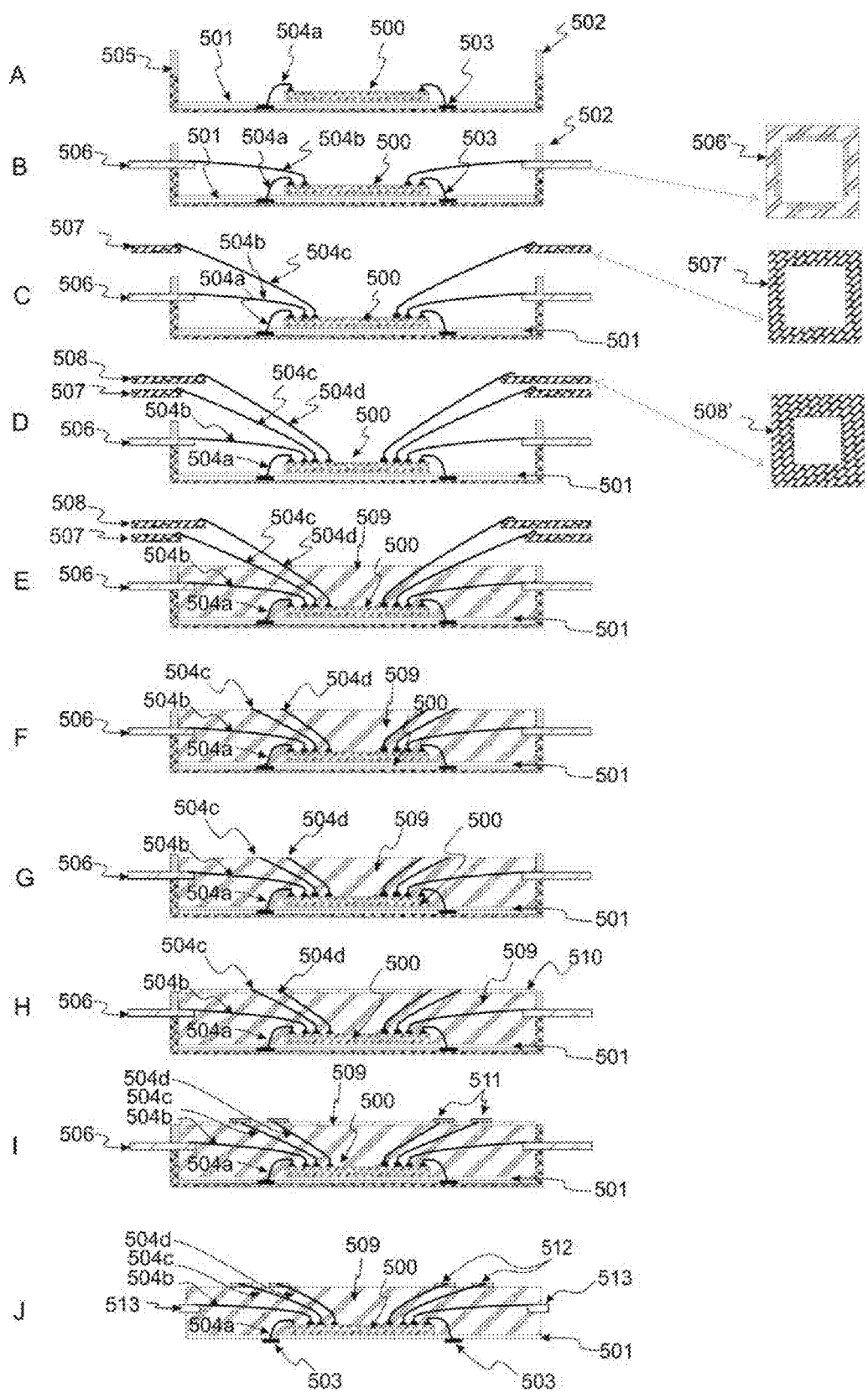
FIG. 5 provides representative process steps for creating one embodiment of the package.

In FIG. 5A an IC chip (500) is attached to a substrate (501) which has contact terminals (503) for wire bonding but which are accessible from bottom through holes in the material. The subassembly is placed in a carrier (502) having spaced slots and the IC is electrically connected to the lower series of terminals using bonding wires (504a).

In FIG. 5B a leadframe (506) having spaced contacts, (shown in a top view in 506') is fitted to the carrier and second series of wire bonds (504b) are made from the chip to the leadframe.

In FIG. 5C a third series of wire bonds (504c) are made from the IC chip to programmed locations on the mandrel (507). The bonding mandrel (shown in top view in 507') has an opening in it. The opening size is dependent on the design and can be greater than, equal to or smaller than the mandrel is held in an alignment fixture (the fixture is not shown) above the carrier and the wire bond connections from the IC chip are made to the surface of the mandrel.

In FIG. 5D a fourth (or nth) series of wire bonds (504d) are made from the IC chip to programmed locations on the mandrel (508). The bonding mandrel (shown in top view in 508') has an opening in it. The opening size is dependent on the design but is generally smaller that the mandrel below it (507). The mandrel is fixtured (the fixturing is not shown) above the carrier and the wire bond connections from the IC chip are made to the mandrel.

In FIG. 5E the assembly carrier is filled with an encapsulant (509) to secure the wires in their locations and to protect the assembled IC.

In FIG. 5F the wires on the upper surface (504c and 504d) are trimmed to the approximately the level of the surface using an appropriate means and the mandrels are removed.

In FIG. 5G an optional encapsulant etching step is used to clean and expose the bond wire ends (504c and 540d).

In FIG. 5H the top surface of the carrier is processed so as to plate the surface with a suitable metal such as copper (510). The metal surrounds and encapsulates the wire ends.

In FIG. 5I is shown a contact pattern imaging step with an etch resist to define the terminal locations (511).

In FIG. 5J the etching step has removed the excess copper from the face of the package and the resist is stripped exposing the remaining metal contact terminals (512) which are connected directly to the wires. The side terminals of the leadframe are trimmed to length (513) and the structure is removed from the carrier providing access to the bottom terminals (503).

If the carrier is made from an insulating material, it need not be removed. Access to the terminals (503) can be made by a suitable means (such as laser drilling) either before or after processing.

Figure 6:
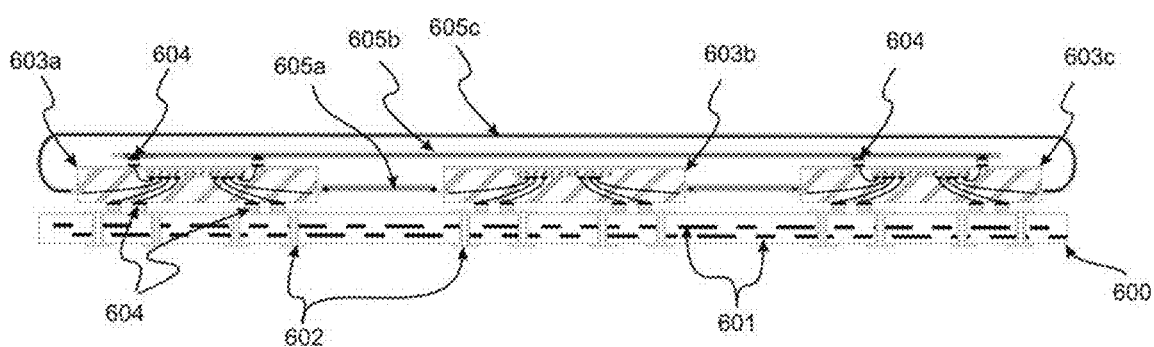
FIG. 6 shows how packages created using the concepts of the invention can potentially be interconnected taking advantage of all of the surfaces.

FIG. 6 illustrates how the invention can be employed in the manufacture of an electronic assembly. In the figure an interconnection substrate such as a PCB (600) having circuits traces (601) interconnected to one another by means of plated through holes (602) has IC packages of the type of the invention (603a-603c) mounted on and interconnected to the interconnection substrate by a suitable means such as solder balls (604). A first cable (605a) as a controlled impedance cable to improve signal integrity and using a suitable means of interconnection such as connectors or lapped joints, can provide lateral direct connection between adjacent packages at a mid level. A second cable (605b) connected by means of solder balls can provide upper surface connections between adjacent or distant IC packages. A third (or nth) cable (605c) can provide lateral connection between distal IC packages.

While not illustrated, it is also possible to plate the bond wires with a high modulus material to strengthen the leads so that they can be interconnected directly to a next level interconnection substrate. The finished structure would resemble the encapsulated embodiments of the invention with the encapsulation removed and the stiffness of the wires would cause them to hold their relative position and reduce or eliminate the potential for shorting of the leads.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. A method of manufacturing an integrated circuit package that includes a first IC die with a plurality of die terminals on an active surface of the first IC die, the method comprising:
   positioning a first temporary structure above an IC die;
   coupling a first end of a first bond wire to a first IC die terminal; and,
   coupling a distal section of the first bond wire to a first point on the first temporary structure, such that the first bond wire passes through a first predetermined point in space.

2. The method according to claim 1, further comprising:
   covering a section of the first bond wire with an encapsulant;
   forming a surface of the encapsulaint such that the first predetermined point in space is disposed proximate a portion of the encapsulant surface; and,
   removing the first temporary structure.

3. The method according to claim 2, further comprising covering at least part of the IC die with the encapsulant.

4. The method according to claim 2, further comprising coupling an IC package lead to the first wire bond proximate the first predetermined point in space.

5. The method according to claim 4, further comprising:
   coupling a first end of a second bond wire to a second IC die terminal; and,
   coupling a distal section of the second bond wire to a second point on the first temporary structure, wherein the first bond wire passes through a second predetermined point in space;
   covering a section of the second bond wire with the encapsulant; and
   forming the surface of the encapsulaint such that the second predetermined point in space is disposed proximate a portion of the encapsulant surface.

6. The method according to claim 2, further comprising coupling a second IC package lead to the second bond wire proximate the second predetermined point in space.

7. The method according to claim 4, wherein the first IC package lead and the second IC package lead are arranged in stair-step formation.

8. The method according to claim 1, further comprising:
   positioning a second temporary structure above the IC die;
   coupling a first end of a second bond wire to a second IC die terminal; and,
   coupling a section of the second bond wire to a first point on the second temporary structure, such that the second bond wire passes through a predetermined second point in space.

9. The method according to claim 8 wherein the first temporary structure is a first ring mandrel that includes a first aperture.

10. The method according to claim 9 wherein the second temporary structure is a second ring mandrel that includes a second aperture, the first aperture being aligned between the IC die and the second aperture.

11. The method according to claim 10 wherein the second aperture has a smaller cross sectional area than the first aperture.

12. The method according to claim 11, further comprising:
    positioning a third temporary structure with a third aperture above the IC die, such that the second aperture is aligned between the IC die and the third aperture;
    coupling a first end of a third bond wire to a third IC die terminal; and,
    coupling a section of the third bond wire to a first point on the third temporary structure, such that the second bond wire passes through a predetermined second point in space.

13. The method according to claim 12, wherein the third aperture has a smaller cross sectional area than the second aperture.

14. The method according to claim 1 wherein, in a fully manufactured state, the integrated circuit package comprises at least one upward facing surface, one downward facing surface, a forward facing surface, a reward facing surface, and first and second side surfaces facing in opposite directions from each, the side surfaces being at right angles relative to the forward and rearward facing surfaces.

15. The method according to claim 14 wherein the at least one upward facing surface comprises a plurality of upward facing stair step surfaces.

16. The method according to claim 14, further comprising the step of fabricating at least one IC package contact on at least one upward facing surface, at least one IC package contact on the downward facing surface, at least one IC package contact on the first side surface, and at least one IC package contact on the second side surface.

17. The method according to claim 16, further comprising the step of fabricating at least one IC package contact on the forward facing surface.

18. The method according to claim 17, further comprising the step of fabricating at least one IC package contact on the rearward facing surface.

19. The method according to claim 1, wherein the first bond wire extends along a substantially linear path from the first IC die terminal to the first predetermined point in space.

20. The method of claim 1 further comprising the steps:
    positioning a lower surface of a second IC die above the active surface of the first IC die, the second IC die having an active surface with a plurality of IC die terminals, wherein a cross sectional area of the lower surface of the second IC die is smaller than a cross sectional area of the active surface of the first IC die; and
    coupling a first end of a second bond wire to a first IC die terminal on the second IC die.

21. The method of claim 1 further comprising the step of depositing an encapsulant on portions of the first and second IC die, including portions of the first and second bond wires.

* * * * *